(12) United States Patent
Lin

(10) Patent No.: US 9,948,244 B1
(45) Date of Patent: Apr. 17, 2018

(54) AMPLIFIER WITH ADJUSTABLE GAIN

(71) Applicant: Faraday Technology Corp., Hsinchu (TW)

(72) Inventor: Chih-Huang Lin, Kaohsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/385,871

(22) Filed: Dec. 21, 2016

(30) Foreign Application Priority Data

Oct. 13, 2016 (TW) .............................. 105133010 A

(51) Int. Cl.
| H03F 3/45 | (2006.01) |
| H03G 3/30 | (2006.01) |
| H03F 3/19 | (2006.01) |
| H03F 1/30 | (2006.01) |

(52) U.S. Cl.
CPC ......... *H03F 1/301* (2013.01); *H03F 3/45273* (2013.01); *H03G 3/30* (2013.01); *H03F 2200/555* (2013.01); *H03F 2203/45594* (2013.01)

(58) Field of Classification Search
USPC ............... 330/252–261, 295, 124 R, 84, 286
See application file for complete search history.

(56) References Cited

U.S. PATENT DOCUMENTS

| 5,418,494 A * | 5/1995 | Betti ................... H03G 1/0023 330/254 |
| 7,583,144 B1 | 9/2009 | Voo |
| 8,456,236 B2 | 6/2013 | Moldsvor et al. |
| 2007/0075774 A1 | 4/2007 | Yoshizawa et al. |
| 2013/0154737 A1 | 6/2013 | Shu |

OTHER PUBLICATIONS

"Office Action of Taiwan Counterpart Application," dated Jan. 25, 2017, p. 1-p. 5.

\* cited by examiner

*Primary Examiner* — Hieu Nguyen
(74) *Attorney, Agent, or Firm* — Winston Hsu

(57) ABSTRACT

An amplifier with adjustable gain including a plurality of differential amplifiers and an output stage circuit is provided. Each of the differential amplifiers has at least one differential pair, two current terminals of each of the differential pairs are coupled by a connection structure, and the connection structure provides a negative feedback resistance. The differential amplifiers commonly receive a differential input signal pair, and output terminals of the differential amplifiers are coupled together. The output stage circuit inverts a voltage on the output terminals of the differential amplifiers to generate an output voltage. A direct current gain of the amplifier with adjustable gain is determined by adjusting at least one of working numbers of the differential amplifiers and the differential pairs.

19 Claims, 7 Drawing Sheets

AMPLIFIER WITH ADJUSTABLE GAIN

CROSS-REFERENCE TO RELATED APPLICATION

This application claims the priority benefit of Taiwan application serial no. 105133010, filed on Oct. 13, 2016. The entirety of the above-mentioned patent application is hereby incorporated by reference herein and made a part of this specification.

BACKGROUND OF THE INVENTION

Field of the Invention

The invention relates to an amplifier with adjustable gain, and particularly relates to an amplifier with adjustable gain applied to a high-speed transmission interface.

Description of Related Art

In a conventional technical domain, an amplifier applied to a high-speed transmission interface has a negative feedback resistor, and in an adjustment operation of a direct current (DC) gain of the amplifier, the negative feedback resistor is accordingly adjusted, and a high-frequency peaking of the amplifier is accordingly varied. FIG. 1 is a frequency response diagram of a conventional amplifier. In FIG. 1, a curve 101 has a higher DC gain compared with that of a curve 103, and a resistance value of the negative feedback resistor of the amplifier working under the curve 101 is smaller than a resistance value of the negative feedback resistor of the amplifier working under the curve 103.

According to FIG. 1, it is clearly known that regarding the amplifier working under the curve 103, a gain value of the amplifier corresponding to a frequency FH1 is greatly varied compared to the DC gain of the amplifier corresponding to a low frequency. Namely, the conventional amplifier working under a low DC gain state may have a large high-frequency peaking variation.

SUMMARY OF THE INVENTION

The invention is directed to an amplifier with adjustable gain, which is adapted to decrease a variation amount of a high-frequency peaking of an output voltage.

The invention provides an amplifier with adjustable gain, which includes a plurality of differential amplifiers and an output stage circuit. Each of the differential amplifiers has at least one differential pair, and two current terminals of each of the differential pairs are coupled by a connection structure, and the connection structure provides a negative feedback resistance. The differential amplifiers commonly receive a differential input signal pair, and output terminals of the differential amplifiers are coupled to each other. The output stage circuit is coupled to the output terminals of the differential amplifiers, and inverts a voltage on the output terminals of the differential amplifiers to generate an output voltage. A direct current gain of the amplifier with adjustable gain is determined by adjusting at least one of working numbers of the differential amplifiers and the differential pairs.

According to the above description, a plurality of differential amplifiers is used to provide a plurality of transduction units, so as to decrease the influence on a threshold frequency. In this way, regardless under a high gain or low gain working condition, the gain value of the amplifier with adjustable gain is not greatly varied along with increase of frequency, so as to ensure a magnitude of a bandwidth thereof.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
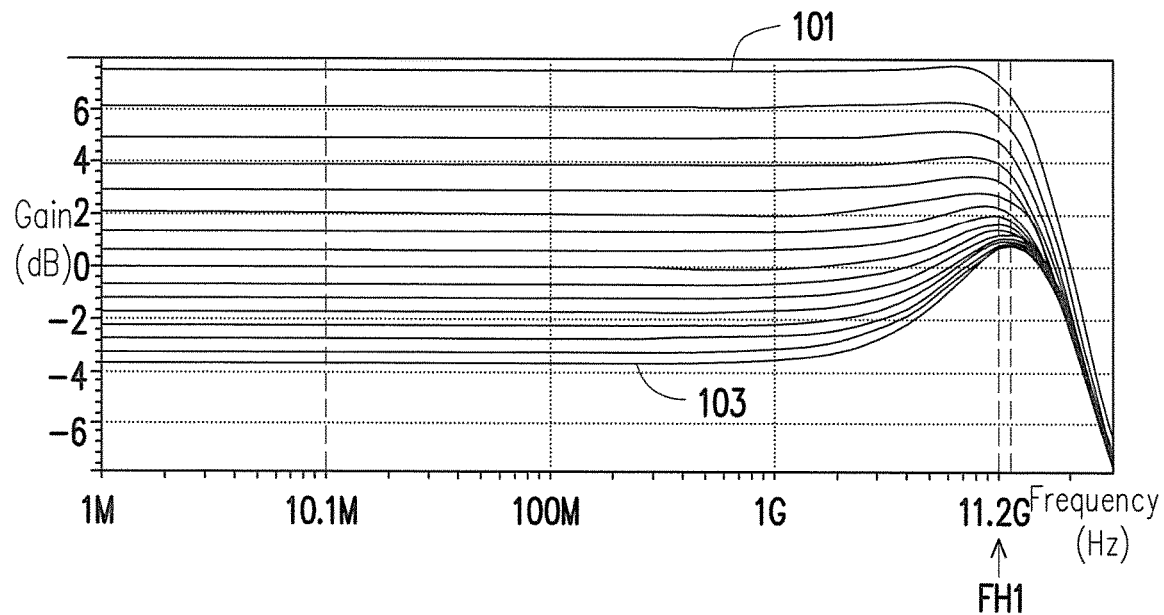
FIG. 1 is a frequency response diagram of a conventional amplifier.
Figure 2:
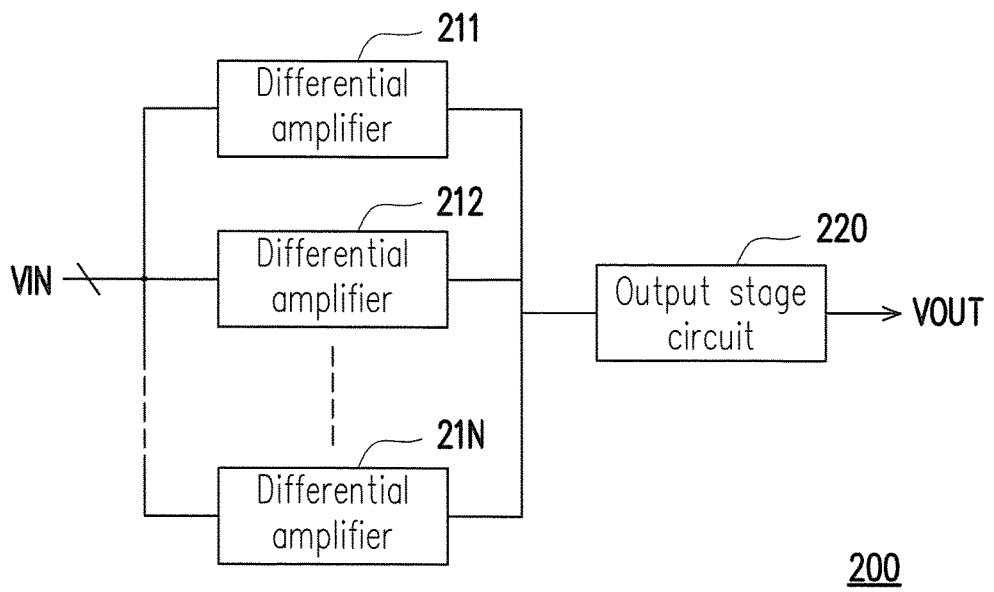
FIG. 2 is a schematic diagram of an amplifier with adjustable gain according to an embodiment of the invention.

Referring to FIG. 2, FIG. 2 is a schematic diagram of an amplifier with adjustable gain according to an embodiment of the invention. The amplifier with adjustable gain 200 can be applied to a high-speed transmission interface, and includes a plurality of differential amplifiers 211-21N and an output stage circuit 220. The differential amplifiers 211-21N commonly receive a differential input signal pair VIN, and output terminals of the differential amplifiers 211-21N are commonly coupled to the output stage circuit 220. The output stage circuit 220 generates an output voltage VOUT.

In the present embodiment, each of the differential amplifiers 211-21N has a plurality of differential pairs, and two current terminals of each of the differential pairs are coupled by a connection structure, and the connection structure provides a negative feedback resistance. When an adjustment operation is performed to a direct current (DC) gain of the amplifier with adjustable gain 200 is performed, the adjustment operation can be implemented by adjusting the number of working differential pairs in each of the differential amplifiers 211-21N, or adjusting a working number of the differential amplifiers 211-21N, or simultaneously adjusting the working numbers of the differential amplifiers 211-21N and the differential pairs therein.

The output stage circuit 220 is coupled to the output terminals of the differential amplifiers 211-21N. The output stage circuit 220 inverts a voltage on the output terminals of the differential amplifiers 211-21N to generate an output voltage VOUT.

A working principle of the amplifier with adjustable gain of the invention may refer to descriptions of the following embodiments.

Figure 3A:
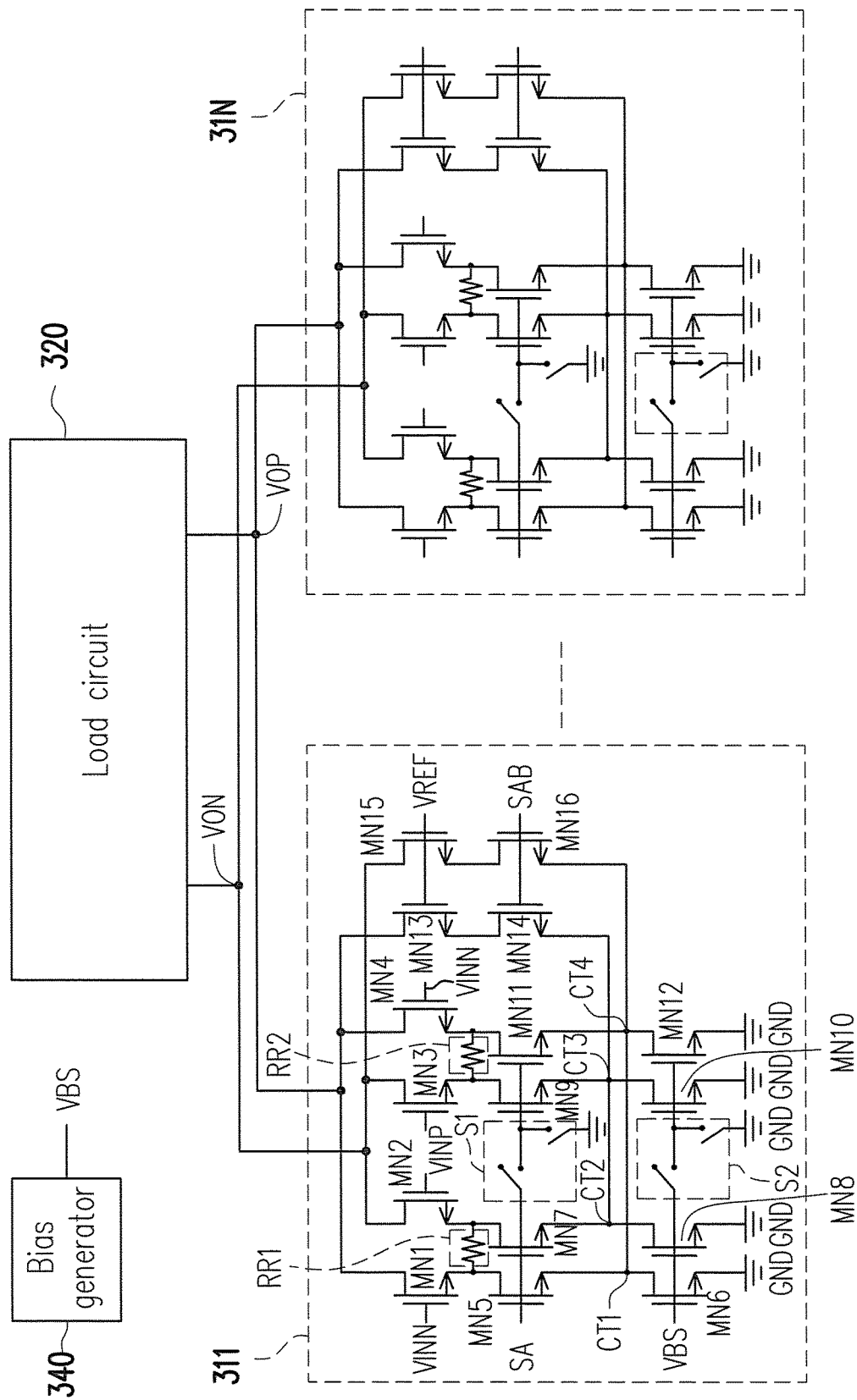
FIG. 3A is an implementation of differential amplifiers according to an embodiment of the invention.

Referring to FIG. 3A, FIG. 3A is an implementation of the differential amplifiers according to an embodiment of the invention. In FIG. 3A, a plurality of differential pair circuits 311-31N commonly share one load circuit 320 to form a plurality of (N) differential amplifiers. Each of the differential pair circuits 311-31N includes a plurality of differential pairs. Taking the differential pair circuit 311 as an example, the differential circuit 311 includes a differential pair formed by transistors MN1 and MN2, and includes another differential pair formed by transistors MN3 and MN4. First terminals of the transistors MN1 and MN2 are respectively coupled to first and second output terminals VOP, VON, second terminals of the transistors MN1 and MN2 are respectively coupled to current terminals CT1 and CT2, and the transistors MN1 and MN2 are respectively controlled by differential input signals VINN and VINP. The differential input signals VINN and VINP are differential signals. First terminals of the transistors MN3 and MN4 are respectively coupled to the second and the first output terminals VON, VOP, second terminals of the transistors MN3 and MN4 are respectively coupled to current terminals CT3 and CT4, and the transistors MN3 and MN4 are respectively controlled by differential input signals VINP and VINN. Moreover, in the present embodiment, the current terminals CT1 and CT4 are coupled to each other, and the current terminals CT2 and CT3 are coupled to each other.

Moreover, the differential pair circuit 311 includes a current generator constructed by transistors MN6, M8, MN10 and MN12. The transistors MN6, MN8, MN10 and MN12 of the current generator receive a bias voltage VBS, and respectively provide a first, a second, a third and a fourth currents to the transistors MN1, MN2, MN3 and MN4.

The bias voltage VBS can be provided by a bias generator 340. The bias generator 340 can be coupled to the transistors MN6, MN8, MN10 and MN12, and generates the bias voltage VBS according to a reference current.

It should be noted that a connection structure RR1 is connected between the transistors MN1 and MN2, and a connection structure RR2 is connected between the transistors MN3 and MN4. In the present embodiment, the connection structures RR1 and RR2 are all physical resistors.

On the other hand, the transistors MN5, MN7, MN9 and MN11 are respectively coupled in series between the current terminals CT1-CT4 and the transistors MN1-MN4. Control terminals of the transistors MN5, MN7, MN9 and MN11 receive a control signal SA.

It should be noted that, the differential pair circuit 311 further includes selectors S1 and S2. When the differential pair formed by the transistors MN3-MN4 executes a task, the selectors S1 and S2 select to respectively provide the control signal SA and the bias voltage VBS to the control terminals of the transistors MN9, MN11 and the transistors MN10, MN12. Comparatively, when the differential pair formed by the transistors MN3-MN4 does not need to execute a task, the selectors S1 and S2 select to provide a ground voltage of a reference ground terminal GND to the control terminals of the transistors MN9, MN11, MN10, MN12 to turn off the transistors MN9, MN11, MN10, MN12.

The differential pair circuit 311 further includes a transistor string formed by transistors MN13 and MN14 and a transistor string formed by transistors MN15 and MN16. The transistor string formed by the transistors MN13 and MN14 are coupled between the current terminal CT2 and the first output terminal VOP, and the transistor string formed by the transistors MN15 and MN16 are coupled between the current terminal CT1 and the second output terminal VON. The transistors MN13 and MN15 are controlled by a reference voltage VREF, and the transistors MN14 and MN15 are controlled by an inverted control signal SAB.

The transistor strings formed by the transistors MN13, MN14 and the transistors MN15, MN16 may be used to form a bypass circuit.

Figure 3B:
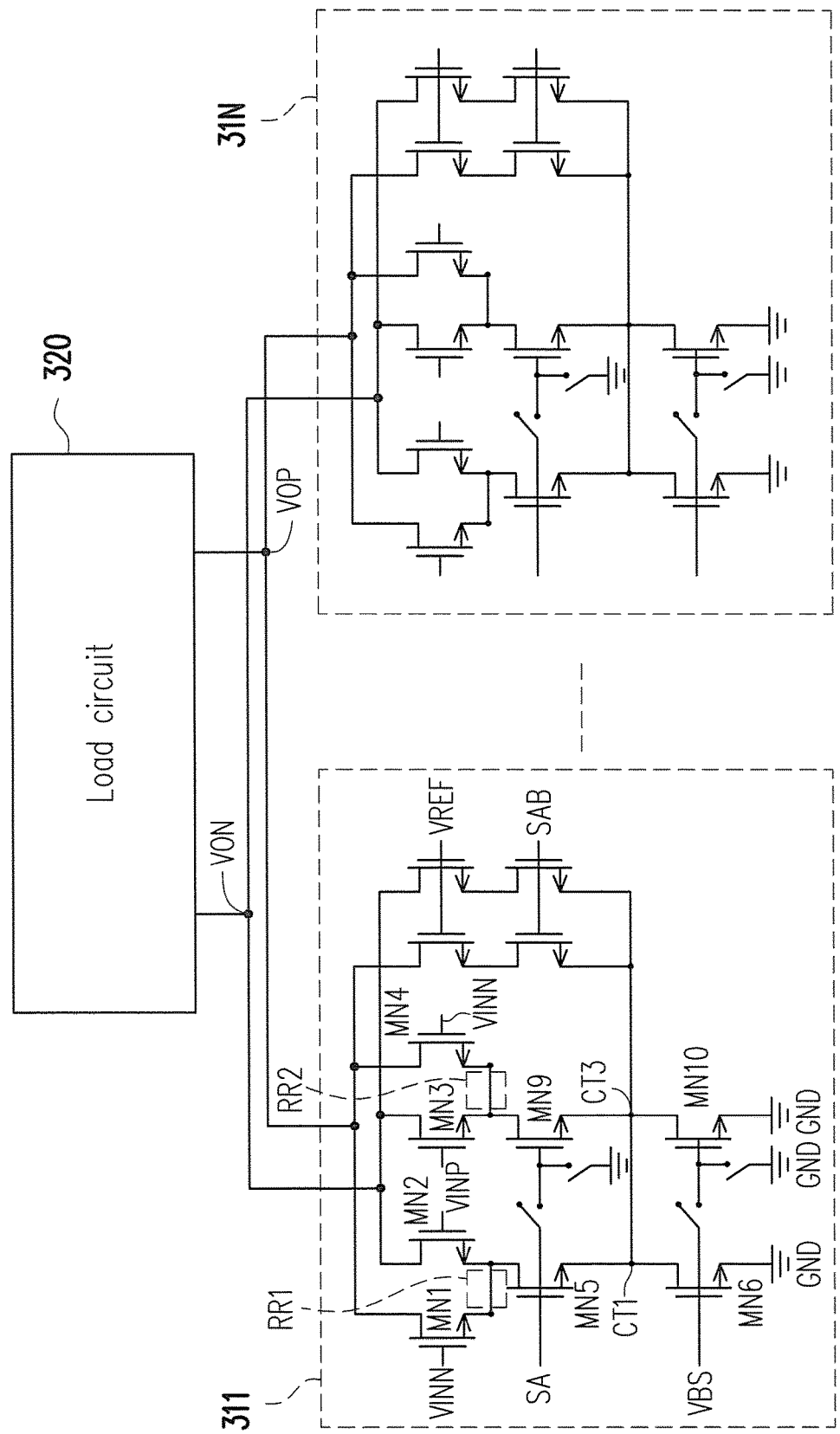
FIG. 3B is another implementation of the differential amplifiers according to an embodiment of the invention.

Referring to FIG. 3B, FIG. 3B is another implementation of the differential amplifiers according to an embodiment of the invention. Different to the embodiment of FIG. 3A, the connection structure RR1 connected between the transistors MN1 and MN2 is a transmission conductive line, and the connection structure RR2 connected between the transistors MN3 and MN4 is also a transmission conductive line. In this way, the current generator in the differential pair circuit 311 only requires two transistors MN6 and MN10 for construction, and the differential pair circuit 311 only has two current terminals CT1 and CT3.

Figure 3C:
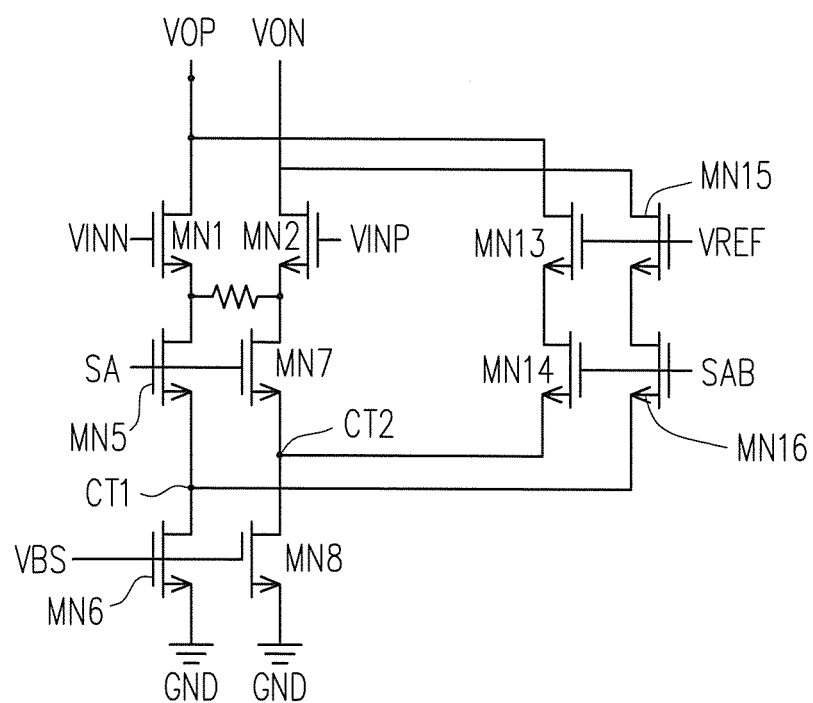
FIG. 3C is still another implementation of the differential amplifiers according to an embodiment of the invention.

Referring to FIG. 3C, FIG. 3C is still another implementation of the differential amplifiers according to an embodiment of the invention. The number of the differential pairs included in each of the differential amplifiers is not specifically limited, in FIG. 3C, the number of the differential pair included in each of the differential amplifiers can be one. The differential amplifier of FIG. 3C includes a differential pair formed by the transistors MN1 and MN2, where first terminals of the transistors MN1 and MN2 are respectively coupled to the first and second output terminals VOP and VON, and second terminals of the transistors MN1 and MN2 are respectively coupled to the current terminals CT1 and CT2, and the transistors MN1 and MN2 are respectively controlled by the differential input signals V1NN and VINP.

Figure 4:
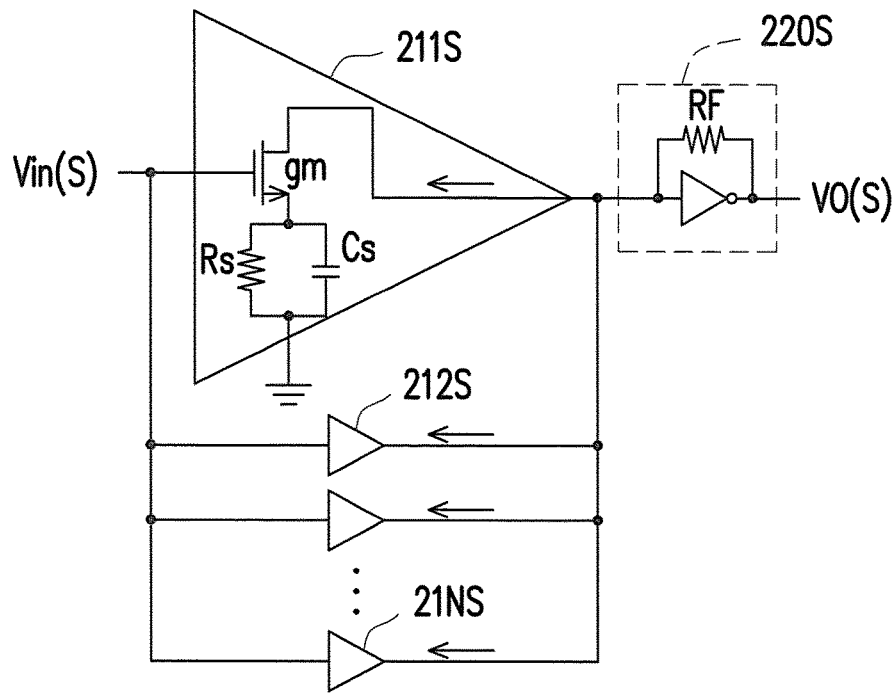
FIG. 4 is a schematic diagram of a small signal equivalent circuit of the amplifier with adjustable gain according to an embodiment of the invention.

Referring to FIG. 4, FIG. 4 is a schematic diagram of a small signal equivalent circuit of the amplifier with adjustable gain according to an embodiment of the invention. Corresponding to the embodiment of FIG. 2, the differential amplifiers 211-21N respectively correspond to equivalent circuits 211S-21NS, and the output stage circuit 220 corresponds to an equivalent circuit 220S. according to the small signal equivalent circuit of FIG. 4, a following equation (1) is deduced:

$$\frac{Vo}{Vi}(S) = k \cdot Gm(S) \cdot RF(s) = k \cdot \frac{gm\left[s + \frac{1}{Rs \cdot Cs}\right]}{\left[s + \frac{1 + gmRs}{Rs \cdot Cs}\right]} \cdot RF(s) \quad (1)$$

Wherein, Vi(s) is a differential input signal, Vo(s) is an output voltage, k is the number of the differential amplifiers activated to carry on tasks, Rs and RF are equivalent resistances, and Cs is an equivalent capacitance.

According to the equation (1), it is known that the DC gain of the amplifier with adjustable gain 200 can be equal to Vo/Vi (where s=0), and can be represented by a following equation (2):

$$DC\ \text{gain} = k \cdot \frac{gm \cdot RF(0)}{1 + gmRs} \quad (2)$$

Where, RF(0) is a constant, so that the DC gain can be changed by adjusting k.

Moreover, according to the equation (1), it is learned that a frequency of a zero point of the amplifier with adjustable gain 200 is $f_{zero}=1/(2\pi RsCs)$, a frequency of a pole point is $f_{pole}=(1+gmRs)/(2\pi RsCs)$. It is known that a high-frequency peaking thereof is $f_{pole}/f_{zero}=1+gmRS$, which is a fixed value.

It should be noted that the gain of the amplifier with adjustable gain 200 can be changed along with variation of an operating frequency. For example, the gain of the amplifier with adjustable gain 200 probably starts to raise when the operating frequency is greater than a predetermined threshold, and a difference between a low frequency gain and a maximum value of the gain of the amplifier with adjustable gain 200 operated at a frequency higher than the predetermined threshold is the high-frequency peaking. According to the aforementioned equation, it is known that the high-frequency peaking of the amplifier with adjustable gain 200 is not changed along with the operating frequency and is a fixed value, so that a magnitude of a bandwidth thereof can be ensured.

Figure 5:
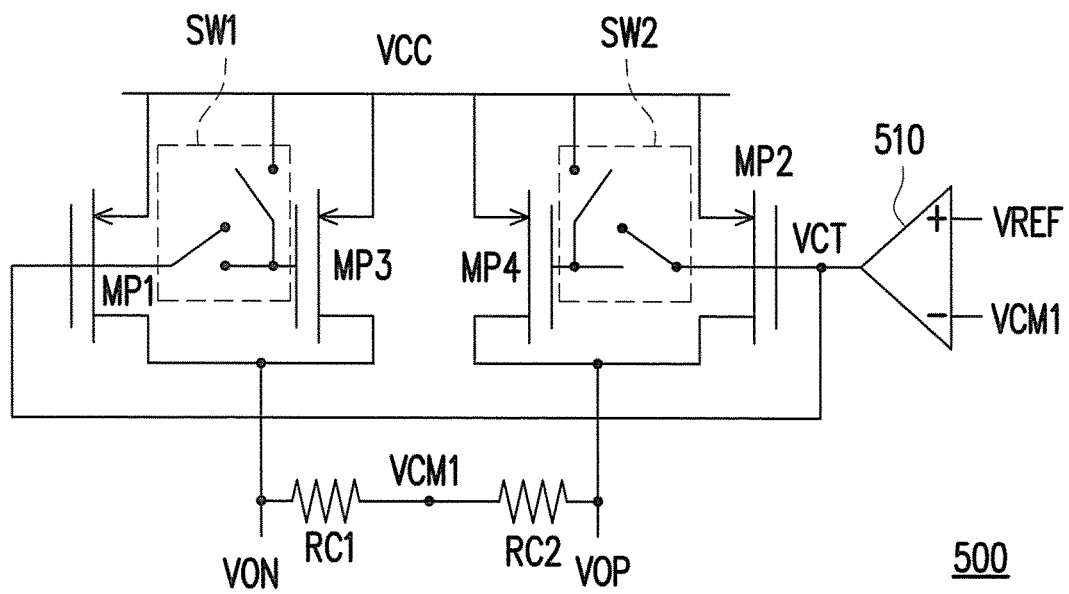
FIG. 5 is a schematic diagram of a load circuit according to an embodiment of the invention.

Referring to FIG. 5, FIG. 5 is a schematic diagram of a load circuit according to an embodiment of the invention. The load circuit 500 includes a plurality of transistors MP1-MP4, switch circuits SW1 and SW2 and a control voltage generator 510. First terminals of the transistors MP1-MP4 are commonly coupled to a power voltage VCC, and control terminals of the transistors MP1-MP4 commonly receive a control voltage VCT. Second terminals of the transistors MP1, MP3 are coupled to the second output terminal VON, and second terminals of the transistors MP2, MP4 are coupled to the first output terminal VOP.

Moreover, the transistors MP1 and MP3 have the switch circuit SW1 therebetween. The switch circuit SW1 controls to transmit the control voltage VCT or the power voltage VCC to a control terminal of the transistor MP3. The transistors MP2 and MP3 have the switch circuit SW2 therebetween. The switch circuit SW2 controls to transmit the control voltage VCT or the power voltage VCC to a control terminal of the transistor MP4. When the transistor MP3 and/or the transistor MP4 receives the power voltage VCC, the transistor MP3 and/or the transistor MP4 is correspondingly turned off without operation. When the transistor MP3 and/or the transistor MP4 receives the control voltage VCT, the transistor MP3 and/or the transistor MP4 may provide an active load.

In the present embodiment, the number of the transistors MP3 and MP4 is not specifically limited, and the number can be plural.

The control voltage generator 510 may be an operational amplifier. The control voltage generator 510 receives a common voltage VCM1 and a reference voltage VREF, and generates the control signal VCT according to a difference between the common voltage VCM1 and the reference voltage VREF. The common voltage VCM1 can be generated by common mode resistors RC1 and RC2. The common mode resistors RC1 and RC2 are connected in series between the first and second output terminals VOP and VON, and generate the common voltage VCM1 by dividing a cross voltage between the first and second output terminals VOP and VON.

Figure 6:
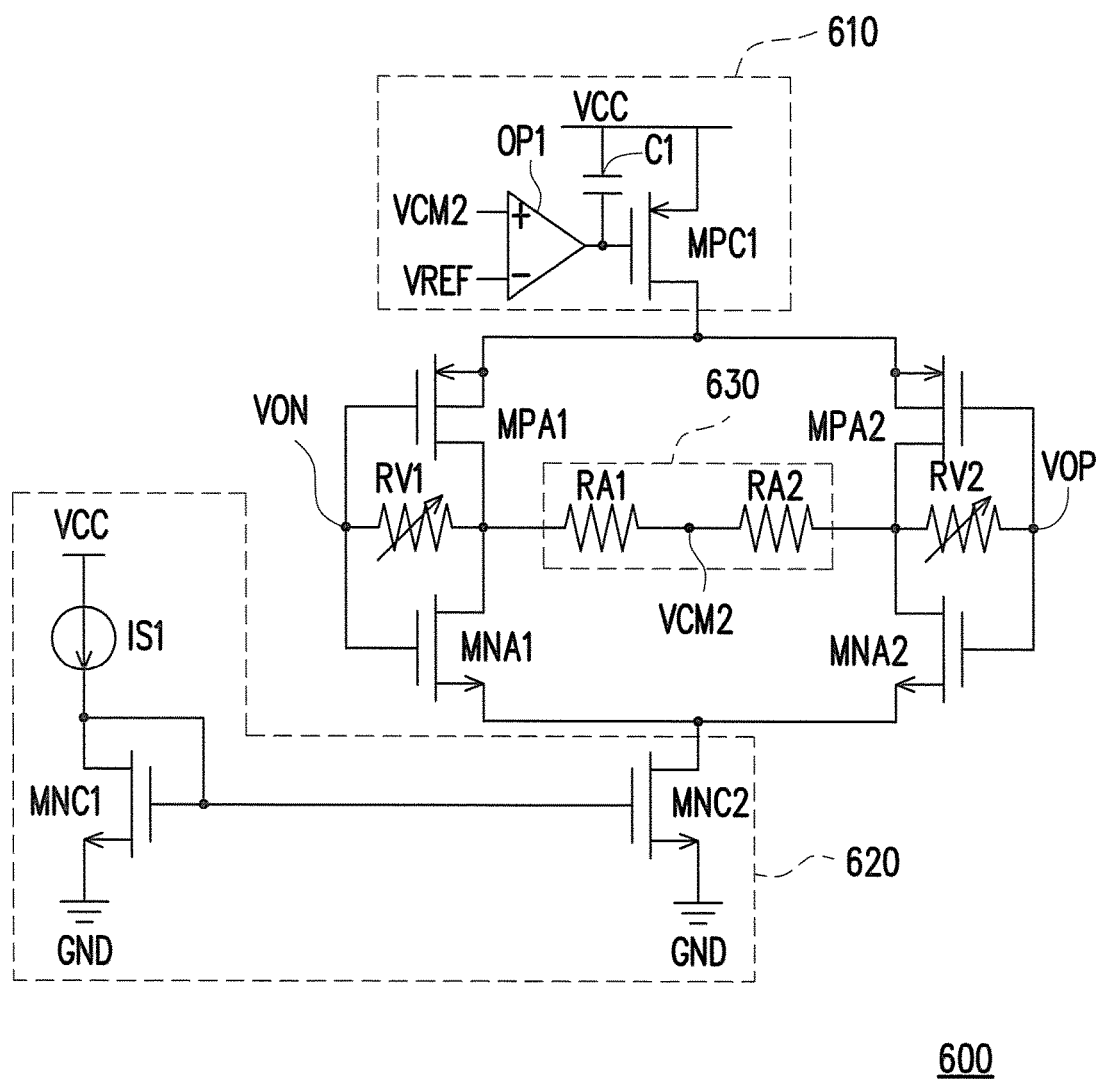
FIG. 6 is a schematic diagram of an output stage circuit according to an embodiment of the invention.

Referring to FIG. 6, FIG. 6 is a schematic diagram of an output stage circuit according to an embodiment of the invention. The output stage circuit 600 includes current sources 610 and 620, transistors MPA1, MPA2, MNA1 and MNA2, variable resistors RV1 and RV2, and a resistor string 630. The current source 610 includes an operational amplifier OP1, a transistor MPC1 and a capacitor C1. The operational amplifier OP1 receives the reference voltage VREF and a common voltage VCM2. The transistor MPC1 is coupled in series between the power voltage VCC and first terminals of the transistors MPA1 and MPA2, and is controlled by an output terminal of the operational amplifier OP1 to generate a current.

The current source 620 is a current minor circuit constructed by transistors MNC1 and MNC2. The current source 620 mirrors a reference current generated by a current source IS1 to facilitate second terminals of the transistors MNA1 and MNA2 draining the current.

Moreover, a second terminal of the transistor MPA1 is coupled to a first terminal of the transistor MNA1, and a second terminal of the transistor MPA2 is coupled to a first terminal of the transistor MNA2. Control terminals of the transistor MPA1 and the transistor MNA1 are coupled to each other, and control terminals of the transistor MPA2 and the transistor MNA2 are coupled to each other. The variable resistor RV1 is coupled between the control terminal and the second terminal of the transistor MPA1, and the variable resistor RV2 is coupled between the control terminal and the second terminal of the transistor MPA2, and the resistor string 630 is connected in series between the second terminals of the transistor MPA1 and the transistor MPA2.

The resistor string 630 includes resistors RA1 and RA2 connected in series, and a coupling node of the resistor RA1 and the resistor RA2 generates the common voltage VCM2.

A coupling node of the transistor MPA1 and the transistor MNA1 generates the output voltage VON, and a coupling node of the transistor MPA2 and the transistor MNA2 generates the output voltage VOP. The output voltage VON and the output voltage VOP can be differential signals.

Figure 7:
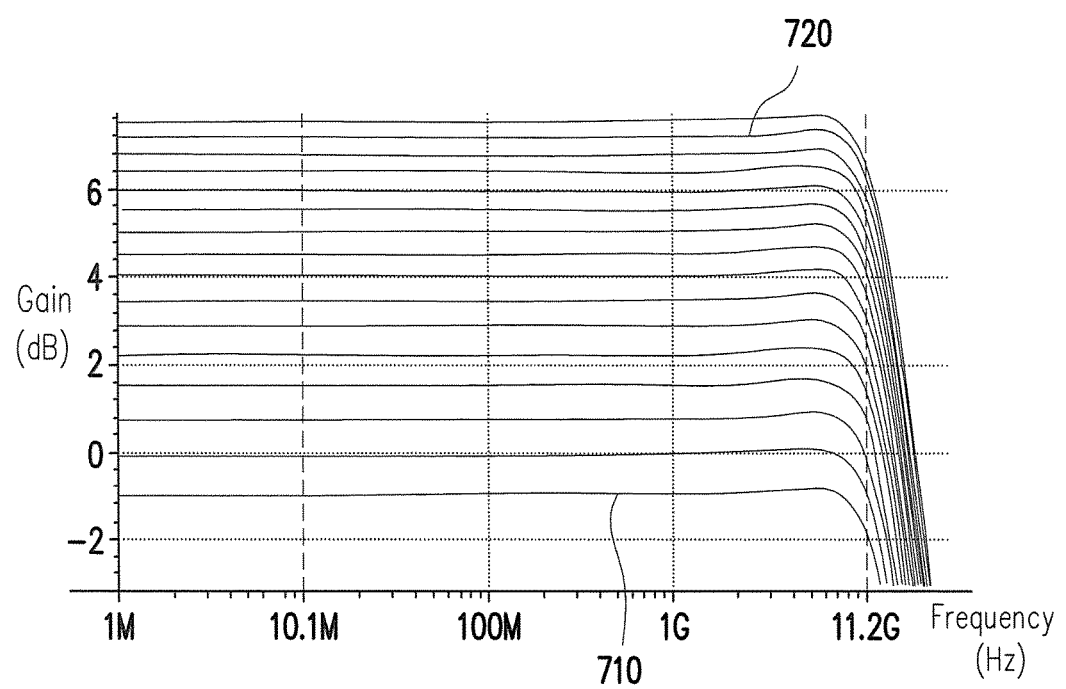
FIG. 7 is a frequency response diagram of an amplifier with adjustable gain according to an embodiment of the invention.

Referring to FIG. 7, FIG. 7 is a frequency response diagram of an amplifier with adjustable gain according to an embodiment of the invention. A plurality of curves in FIG. 7 corresponds to different numbers k of the amplifiers. For example, the number of amplifiers corresponding to a curve 710 is smaller than the number of amplifiers corresponding to a curve 720. According to FIG. 7, it is known that regardless how the DC gain of the amplifier with adjustable gain of the embodiment of the invention is adjusted, a gain difference between the gain thereof at the low frequency and the gain at the high frequency is very smaller. Taking the curve 710 and the curve 720 as an example, the gain difference between the gain at the low frequency and the gain at the high frequency is almost fixed to −954 mdB. Namely, variation of the high-frequency peaking can be maintained to a very small value. The amplifier with adjustable gain of the invention has a relatively stable high-frequency peaking.

In summary, the invention provides a plurality of parallel amplifier circuits to construct the amplifier with adjustable gain, the DC gain thereof is adjusted by adjusting the working numbers of the amplifier circuits. In this way, the bandwidth of the amplifier with adjustable gain is maintained, a harmonic distortion rate is decreased, and a stable high-frequency peaking is provided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An amplifier with adjustable gain, comprising:
a plurality of differential amplifiers, each of the differential amplifiers having at least one differential pair and two transistor strings, wherein two current terminals of each of the at least one differential pair are coupled by a connection structure, and the connection structure provides a negative feedback resistance, the differential amplifiers commonly receive a differential input signal pair, output terminals of the differential amplifiers are coupled to each other, the two transistor strings are respectively coupled between two load terminals and the two current terminals of each of the at least one differential pair, and the two transistor strings are turned on or turned off according to a control signal and a reference voltage; and
an output stage circuit, coupled to the output terminals of the differential amplifiers, and inverting a voltage on the output terminals of the differential amplifiers to generate an output voltage,
wherein a direct current gain of the amplifier with adjustable gain is determined by adjusting at least one of working numbers of the differential amplifiers and the differential pairs.

2. The amplifier with adjustable gain as claimed in claim 1, wherein the differential amplifiers further comprise:
a load circuit, respectively providing a first load and a second load to a first output terminal and a second output terminal, wherein the first output terminal and the second output terminal are respectively coupled to the first load terminal and the second load terminal of each of the at least one differential pair.

3. The amplifier with adjustable gain as claimed in claim 2, wherein the load circuit comprises:
a first transistor, coupled between a power voltage and the second output terminal, and is controlled by a control voltage;
at least one second transistor, coupled between the power voltage and the second output terminal, and is controlled by the control voltage;
at least one first switch circuit, coupled between a path that the at least one second transistor receives the control voltage, so as to turn on or turn off the path that the at least one second transistor receives the control voltage;
a third transistor, coupled between the power voltage and the first output terminal, and controlled by the control voltage;
at least one fourth transistor, coupled between the power voltage and the first output terminal, and controlled by the control voltage; and
at least one second switch circuit, coupled between a path that the at least one fourth transistor receives the control voltage, so as to turn on or turn off the path that the at least one fourth transistor receives the control voltage.

4. The amplifier with adjustable gain as claimed in claim 3, wherein the load circuit further comprises:
a control voltage generator, generating the control voltage according to a common voltage and a reference voltage.

5. The amplifier with adjustable gain as claimed in claim 4, wherein the load circuit further comprises:
a first common mode resistor, having one terminal coupled to the first output terminal, and another terminal receiving the common voltage; and
a second common mode resistor, having one terminal coupled to the second output terminal, and another terminal receiving the common voltage.

6. The amplifier with adjustable gain as claimed in claim 2, wherein each of the differential amplifiers comprises:
a current generator, coupled to the current terminals of the at least one differential pair, and respectively providing a plurality of currents to the current terminals or respectively draining the currents from the current terminals.

7. The amplifier with adjustable gain as claimed in claim 6, wherein the at least one differential pair comprises:
a first differential pair, comprising a first transistor and a second transistor, wherein the first transistor is coupled between the first output terminal and a first current terminal of the first differential pair, and is controlled by a first differential input signal of the differential input signal pair, the second transistor is coupled between the second output terminal and a second current terminal of the first differential pair, and is controlled by a second differential input signal of the differential input signal pair, wherein the first current terminal of the first differential pair and the second current terminal of the first differential pair connect a first connection structure therebetween; and
a second differential pair, comprising a third transistor and a fourth transistor, wherein the third transistor is coupled between the second output terminal and a first current terminal of the second differential pair, and is controlled by the second differential input signal of the differential input signal pair, the fourth transistor is coupled between the first output terminal and a second current terminal of the second differential pair, and is controlled by the first differential input signal of the differential input signal pair, wherein the first current terminal of the second differential pair and the second current terminal of the second differential pair connect a second connection structure therebetween.

8. The amplifier with adjustable gain as claimed in claim 7, wherein the first connection structure and the second connection structure are transmission conductive lines or physical resistors.

9. The amplifier with adjustable gain as claimed in claim 8, wherein when the first connection structure and the second connection structure are physical resistors, the current generator provides a first current and a second current to the first differential pair, and provides a third current and a fourth current to the second differential pair.

10. The amplifier with adjustable gain as claimed in claim 8, wherein when the first connection structure and the second connection structure are transmission conductive lines, the current generator provides a first current to the first differential pair, and provides a second current to the second differential pair.

11. The amplifier with adjustable gain as claimed in claim 7, wherein the current generator comprises:
a plurality of transistors, respectively coupled in series between the current terminals and a reference ground terminal, and generating the currents according to a bias voltage.

12. The amplifier with adjustable gain as claimed in claim 11, wherein the current generator further comprises:
a bias generator, coupled to the transistors, and generating the bias voltage according to a reference current.

13. The amplifier with adjustable gain as claimed in claim 7, wherein two transistor strings further comprise:

a first transistor string, coupled to the first output terminal, the second current terminal of the first differential pair, and the first current terminal of the second differential pair, and turned on or turned off according to the control signal and the reference voltage; and a second transistor string, coupled to the second output terminal, the first current terminal of the first differential pair, and the second current terminal of the second differential pair, and turned on or turned off according to the control signal and the reference voltage.

14. The amplifier with adjustable gain as claimed in claim 13, wherein the first current terminal of the first differential pair, the second current terminal of the first differential pair, the first current terminal of the second differential pair and the second current terminal of the second differential pair are coupled to each other.

15. The amplifier with adjustable gain as claimed in claim 6, wherein the at least one differential pair comprises a first transistor and a second transistor, the first transistor is coupled between the first output terminal and a first current terminal, and is controlled by a first differential input signal of the differential input signal pair, the second transistor is coupled between the second output terminal and a second current terminal, and is controlled by a second differential input signal of the differential input signal pair, wherein the first current terminal and the second current terminal connect a first connection structure therebetween.

16. The amplifier with adjustable gain as claimed in claim 15, wherein each of the differential amplifiers further comprises:
  a first transistor string, coupled between the first output terminal and the second current terminal, and turned on or turned off according to the control signal and the reference voltage; and
  a second transistor string, coupled between the second output terminal and the first current terminal, and turned on or turned off according to the control signal and the reference voltage.

17. The amplifier with adjustable gain as claimed in claim 2, wherein the output stage circuit comprises:
  a first current source, generating a first current;
  a first transistor, having a first terminal receiving the first current, and a control terminal coupled to the second output terminal;
  a second transistor, having a first terminal receiving the first current, and a control terminal coupled to the first output terminal;
  a third transistor, having a first terminal coupled to a second terminal of the first transistor, and a control terminal coupled to the second output terminal;
  a fourth transistor, having a first terminal coupled to a second terminal of the second transistor, a control terminal coupled to the first output terminal, and a second terminal coupled to a second terminal of the third transistor;
  a first variable resistor, coupled in series between the second terminal of the first transistor and the control terminal of the first transistor;
  a second variable resistor, coupled in series between the second terminal of the second transistor and the control terminal of the second transistor;
  a resistor string, connected in series between the second terminal of the first transistor and the second terminal of the second transistor, and generating a common voltage; and
  a second current source, coupled between the second terminal of the third transistor and a reference ground terminal, wherein the second terminal of the third transistor drains a second current.

18. The amplifier with adjustable gain as claimed in claim 17, wherein the first current source comprises:
  an operational amplifier, having a first input terminal receiving the common voltage, and a second input terminal receiving a reference voltage;
  a fifth transistor, coupled in series between a power voltage and the first terminal of the first transistor, and the control terminal of the fifth transistor being coupled to an output terminal of the operational amplifier; and
  a capacitor, coupled in series between the output terminal of the operational amplifier and the power voltage.

19. The amplifier with adjustable gain as claimed in claim 17, wherein the second current source comprises:
  a current mirror circuit, mirroring a reference current to generate the second current.

* * * * *